United States Patent

Keyes et al.

[15] 3,642,544

[45] Feb. 15, 1972

[54] METHOD OF FABRICATING SOLID-STATE DEVICES

[72] Inventors: Robert W. Keyes, White Plains; Kurt Weiser, Millwood, both of N.Y.

[73] Assignee: International Business Machines Corporation, Armonk, N.Y.

[22] Filed: Oct. 7, 1968

[21] Appl. No.: 798,504

Related U.S. Application Data

[62] Division of Ser. No. 476,275, Aug. 2, 1965, Pat. No. 3,440,497.

[52] U.S. Cl. ....................148/175, 148/186

[51] Int. Cl. ....................H01l 7/36, H01l 7/44

[58] Field of Search ....................148/186, 175, 188, 33

[56] References Cited

UNITED STATES PATENTS

| | | | |
|---|---|---|---|
| 3,245,848 | 4/1968 | DeVaux | 148/186 |
| 3,249,831 | 5/1966 | New | 148/186 |
| 3,346,788 | 10/1967 | Belasco | 148/186 |
| 3,362,858 | 1/1968 | Knopp | 148/186 |
| 3,372,069 | 3/1968 | Bailey | 148/175 |
| 3,406,048 | 10/1968 | Immendorfer | 148/175 |
| 3,244,566 | 4/1966 | Mann | 148/33 |
| 3,451,867 | 6/1969 | Taft | 148/175 |

*Primary Examiner*—Hyland Bizot
*Attorney*—Hanifin and Jancin and Bernard N. Wiener

[57] ABSTRACT

An electroluminescent diode with a negative resistance characteristic at room temperature is obtained by establishing a host semiconductor substrate of gallium arsenide crystal with a deep level acceptor impurity such as manganese as the dominant dopant thereby obtaining a P-type semiconductor. On a surface of the gallium arsenide there is epitaxially grown, e.g., by vapor epitaxy, a region of gallium arsenide doped with an N-type dopant, e.g., tellurium. The latter region provides injection of electrons, the minority carriers, into the high-resistivity region when suitable voltage is applied across the diode. On another surface of the host gallium arsenide substrate removed from the tellurium doped region, a shallow level impurity such as zinc is diffused therein to obtain a region dominated thereby. The diffusion produces a high-resistivity zone bounded by the zinc and manganese dominant regions.

At room temperature, e.g., 20° C., and below, the diode shows a high-series resistance at voltages beyond approximately 1 volt. When a critical breakdown voltage is reached, a negative resistance is obtained in which the current goes up with decreasing voltage. The switching speed of the diode from low- to high-current operations is less than 10 nanoseconds for an overvoltage of the order of 1 volt.

8 Claims, 8 Drawing Figures

*INVENTORS*
ROBERT W. KEYES
KURT WEISER

BY Bernard N. Wiener
ATTORNEY

METHOD OF FABRICATING SOLID-STATE DEVICES

This application is a division of copending application Ser. No. 476,275 filed Aug. 2, 1965.

The present invention relates generally to solid state semiconductor devices; and it relates more particularly to an electroluminescent diode having a negative resistance characteristic.

The field of optics in recent years has been undergoing continual development and change, especially in the fields of communications, computers and other allied technologies. This is due in large part to the development of solid state electroluminescent devices and lasers. The development of these devices has made apparent the possibilities of utilizing light both for the transmission of energy and for performing logic operations.

It has previously been discovered, as presented in copending application Ser. No. 326,114 filed Nov. 26, 1963 and issued Aug. 16, 1966 as U.S. Pat. No. 3,267,294, also assigned to the assignee hereof, that an electroluminescent diode can be made having two stable states of operation resultant from a negative resistance characteristic. That discover has also been described in the Journal of Applied Physics, Aug. 1964, pages 2431–2438. It has been found that such a diode may be switched from one stable state to the other by applying a critical threshold or breakdown voltage across the diodes. Alternatively, by shining light within a selected range of wavelengths on the diode it may be switched from the low current state to the high current state.

The properties of gallium arsenide (GaAs) diodes, according to the noted copending application Ser. No. 326,114, now U.S. Pat. No. 3,267,294, with a three layer structure consisting of a central high-resistivity P-type region bounded by low resistivity P-type and N-type regions, are of considerable interest. These three regions are described hereinafter as $P^o$, P and N regions, respectively. A striking phenomenon exhibited by these diodes is that they show a negative resistance over a range of current vs. voltage and that the critical voltage for its onset is light sensitive.

Heretofore, these diodes have required that they be maintained at a very low temperature, e.g., liquid nitrogen temperature of 77° Kelvin in order to exhibit controllably and reproducibly the negative resistance characteristics. Further, the switching time has usually been relatively slow, of the order of microseconds for an overvoltage (applied voltage minus breakdown voltage) of the order of several volts. It is desirable for practical purposes that there is fast switching of an electroluminescent diode at room temperature, e.g., switching in less than ten nanoseconds at 20° Centigrade.

Because of the practical value of such electroluminescent diodes, it is important that they be fabricated controllably and reproducibly. In particular, for a $PP^oN$ GaAs diode obtaining a controllable and reproducible negative resistance characteristic is an objective of the fabrication. Heretofore, the available techniques for fabricating the diodes did not meet these requirements.

As described in the noted Ser. No. 326,114, the prior diode can be fabricated starting with an N-type substrate. There is one region of low resistivity with a shallow level acceptor material therein, e.g., zinc, with another region contiguous to the first region of high resistivity with a deep level acceptor impurity material therein, e.g., manganese, and another region contiguous to the second region of low resistivity with a donor impurity material thereon, e.g., tellurium. To fabricate the prior diode, manganese is diffused into one surface of the N-type substrate and this is followed by a much shallower diffusion of zinc therein. It is difficult to control the length of the central region which is one of the operational parameters determining the value of the threshold voltage for switching from the low-current state to the high-current state. Further, the region dominated by the manganese is nonuniformly doped which makes the electrical and optical processes complex.

It is an object of the invention to provide a semiconductor device and method of fabrication thereof.

It is another object of the present invention to provide an electroluminescent diode with negative resistance and having fast switching speed.

It is another object of this invention to provide such a diode capable of fast switching speeds of a few nanoseconds at room temperature and below.

It is still another object of this invention to provide such a diode from a single gallium arsenide crystal doped with shallow level acceptors, deep level acceptors and donors.

It is another object of this invention to provide such a diode having: one region of low resistivity and having a shallow level acceptor impurity therein; another region contiguous to the first region of high resistivity with a deep level acceptor impurity therein; and another region contiguous to the latter region with a suitable donor impurity therein.

Generally, the invention provides a semiconductor device and method of fabrication thereof, having a low resistivity region in a semiconductor body dominantly doped with an impurity of one conductivity type; a high-resistivity region contiguous to the latter region dominantly doped with an impurity of the same conductivity type and forming one boundary of a bounded zone contiguous to the low resistivity region, the bounded zone having higher resistivity than either the low-resistivity region or the remainder of the high-resistivity region; together with means for making a nonrectifying contact to the low-resistivity region and means for injecting minority carriers into the high-resistivity region.

Such a device is obtained specifically by establishing a host semiconductor substrate of gallium arsenide crystal with a deep level acceptor impurity such as manganese as the dominant dopant thereby obtaining a P-type semiconductor. On a surface of the gallium arsenide there is epitaxially grown, e.g., by vapor epitaxy, a region of gallium arsenide doped with an N-type dopant, e.g., tellurium, selenium or silicon. The latter region provides injection of electrons, the minority carriers, into the high-resistivity region when suitable voltage is applied across the diode. On another surface of the host gallium arsenide substrate removed from the tellurium doped region, a shallow level impurity such as zinc is diffused therein to obtain a region dominated thereby. The diffusion produces a high-resistivity region bounded by the zinc and manganese dominant regions.

At room temperature, e.g., 20° Centigrade, and below, the diodes of this invention show a high series resistance at voltages beyond approximately 1 volt. When a critical breakdown voltage is reached, a negative resistance region sets in, in which the current goes up with decreasing voltage.

Electroluminescence occurs in the diode both before and after breakdown. The spectral intensity distribution of the two states of operation of the diode, i.e., before and after breakdown, does not vary considerably. However, the light intensity per unit current of the overall light varies considerably between these two states. The light intensity per unit current in a number of operating diodes was between ten and one hundred times greater in the high-current state than in the low current state. The switching speed of the diode from low to high-current operation is quite rapid, less than 10 nanoseconds for an overvoltage of the order of 1 volt, thus making the device a potential high-speed logic circuit element.

The practice of the present invention allows more precise dimensional control of the structure to be obtained than the conventional method of fabricating three layer structures which requires two successive diffusions. In the exemplary case of GaAs, it avoids diffusion of a donor impurity, which is an important advantage because no fast-diffusing donor impurity is known for GaAs.

The diode of the present invention has potential utility as a light amplifier, which makes it suitable for use in an image converter. Further, the characteristic of optical switching together with the two optical states makes the device suitable for inclusion in a wide variety of optical logic circuits.

The foregoing and other objects, features and advantages of the invention will be apparent from the following more particular description of a preferred embodiment of the invention, as illustrated in the accompanying drawings.

Figure 1A:
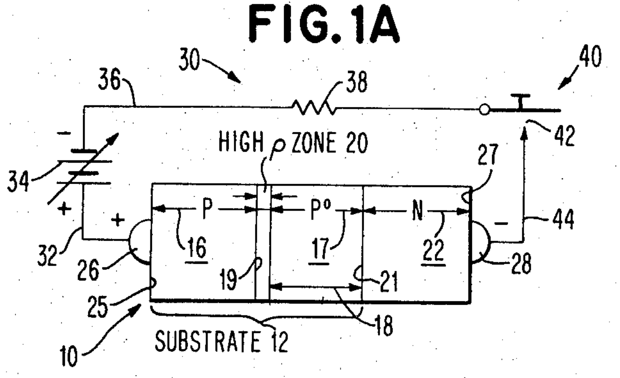
FIG. 1A is a schematic diagram of an electroluminescent diode according to this invention connected for operation in an electrical circuit.

The nature of the invention and its operation for an embodiment thereof will be understood through review of the figures. In FIG. 1 there is presented a schematic diagram of an electroluminescent diode 10 interconnected with operational electric circuitry for establishing electrical conduction with resultant electroluminescence.

The structural nature of an electroluminescent diode 10 is generally that of a semiconductor body 10 with regions 16, 17 and 22 therein which, for convenience of exposition, are connected P, P°, and N. Ohmic contacts 26 and 28 are on the outer surfaces 25 and 27 of regions 16 and 22, respectively. Interface surfaces 19 and 21 demarcate region 16 from region 17 and region 22 from region 17, respectively. Region 17 is further discriminated as a relatively thick zone 18 and a relatively thin zone 20, of which zone 20 is of particularly high resistivity compared to the resistivities of region 16 and zone 18.

The electroluminescent diode 10 is fabricated from a substrate 12, which specifically for the embodiment of the invention disclosed herein is a wafer of gallium arsenide (GaAs) doped with manganese (Mn), at a typical concentration of $5\times10^{17}$ cm.$^{-3}$. The substrate 12 is doped with the manganese in selected concentrations for particular resistivities. Usually, it is desirable that the manganese doping be uniform throughout the host substrate.

In a more general way, the substrate 12 is a host semiconductor body having an acceptor impurity therein thereby establishing it in a relatively high-resistivity condition and characterizable as a P-type semiconductor. An N-type region 22 is produced by epitaxial growth on substrate 12 at interface 21 either from solution or vapor. The donor impurity material for the N-type region 22 may be chosen, for example, from the group consisting of tellurium (Te), selenium (Se) and silicon (Si) at a typical concentration of $10^{18}$ cm.$^{-3}$. A P-type region is obtained in substrate 12 by diffusing a shallow level acceptor impurity material such as zinc therein at surface 25 to form a low resistivity region 16. As consequence of the diffusion, there is produced between the zinc diffused region 16 and zone 18 of the substrate 12 another zone 20 having a higher resistivity than either the bounding region 16 or zone 18. Illustratively, the widths of the P, P° and N regions 16, 17 and 22 are conveniently made to be 1 mil.

Ohmic contacts 26 and 28 are conventionally established on the region 16 and the N region 22 respectively, for effecting electrical conduction in electroluminescent diode 10. An electric circuit 30 is connected to diode 10 to obtain an exemplary operation. There is a conductor 32 connected to ohmic contact 26 whose other end is connected to the positive terminal of a variable DC voltage source 34 whose negative terminal is connected via conductor 36 to one end of resistor 38. The other end of resistor 38 is connected via open-close switch 40 whose contact 42 is connected via conductor 44 to ohmic contact 28.

Figure 1B:
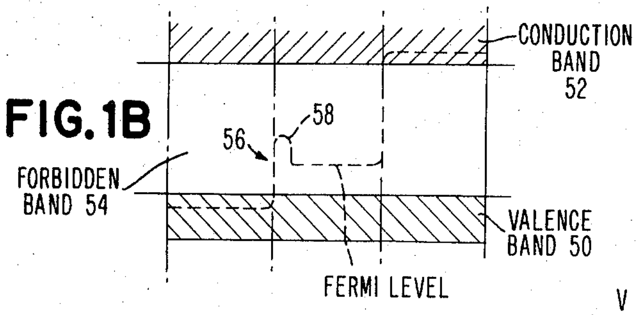
FIG. 1B is an energy band diagram illustrating schematically the nature of the Fermi level in the three regions of the diode of FIG. 1.
Figure 1C:
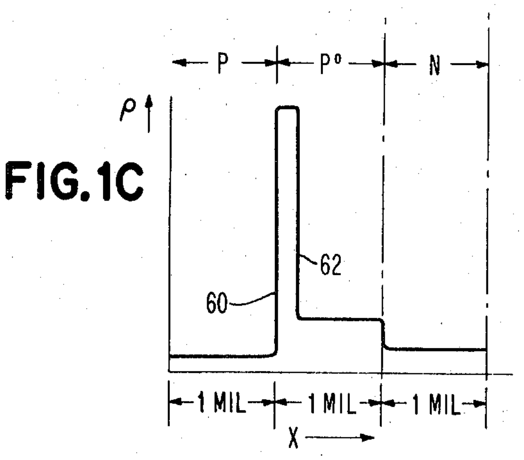
FIG. 1C is a schematic resistivity vs. distance curve between the ohmic contacts of the diode of FIG. 1 illustrating the high-resistivity zone therein.

The special structural characteristics of electroluminescent diode 10 will be understood through consideration of FIGS. 1B and 1C which are, respectively, an energy band diagram showing the Fermi level and a resistivity diagram with respect to distance from the outer contact surface 25 of the P region 16 to the outer surface 27 of the N region 22. In FIG. 1B the valence band 50 and conduction band 52 bound the forbidden band 54. The Fermi level for the three P, P° and N regions of FIG. 1A is shown as a dotted line 56 which, for diagrammatic purpose, is shown as a horizontal line in regions 16 and 22 and zone 18. Additionally, in zone 20 the Fermi level 56 has a peak 58 indicative of the high resistivity of zone 20.

In FIG. 1C the nature of the high resistivity zone 20 is further characterized in terms of a resistivity vs. distance diagram 60 across the length of the electroluminescent diode 10 between the ohmic contacts 26 and 28. The sharp peak 62 of the resistivity vs. distance curve 60 is related in position to peak 58 of the Fermi level of FIG. 1B. The peak 62 is shown in FIG. 1C as covering a significant portion of the P° region of FIG. 1A, but this is done merely for illustrative purpose since, in fact, it is an extremely narrow zone, usually less than 0.1 mil.

The precise nature of the high-resistivity zone 20 is not known. It is speculated that it is a depletion region in which the manganese concentration is considerably less than in the rest of the P° region. However, its function in the switching mechanism is better understood. It is presumed that the high-resistivity zone 20 is converted to a zone of low resistivity by the absorption of light therein by a regenerative process. The light is produced by the recombination of electrons and holes in both region 16 and zone 18. The process of light absorption in region 20 together with increased quantum efficiency with increasing current allows an increased current to be passed through diode 10 between ohmic contacts 26 and 28 with decreasing voltages, i.e., there is a negative resistance. This negative resistance occurs only if a critical voltage is applied across diode 10.

Figure 2:
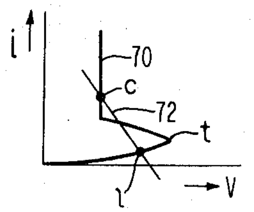
FIG. 2 is a current vs. voltage curve for a diode of this invention illustrating its negative resistance characteristic and the two stable states.

The switching character of an electroluminescent diode in accordance with the principles of this invention will be understood through consideration of FIG. 2 which presents an exemplary curve 70 of current vs. voltage indicating that two stable operating points are obtained as consequence of a negative resistance characteristic. When the switch 40 of FIG. 1 is closed via contact 42, and the voltage 34 is increased, a stable operating point "*l*" is obtained which is determined by the resistance load line 72. On increase of the voltage 34 beyond the voltage peak point "*t*," a rapid switching of the state of the diode to point "*c*" is obtained. Effectively, the slope of the load line 72 is determined by resistance 38 in the electric circuit of FIG. 1. If the voltage is reduced from the value at point "*c*," the diode turns off, and upon increase thereof again, the operating point "*l*" is again obtained.

Although diode 10 exhibits electroluminescence at both stable operating points "*l*" and "*c*," the efficiency of light emission, i.e., quantum efficiency, is much lower when the diode is in its former high-resistivity state than when it is in its latter low-resistivity state. A typical value of the quantum efficiency at room temperature in the low-resistance state is 0.2 percent (2 photons emitted per 1,000 carriers passing through body 10), while the quantum efficiency at the high-resistance state is lower by at least a factor of 10.

Figure 3:
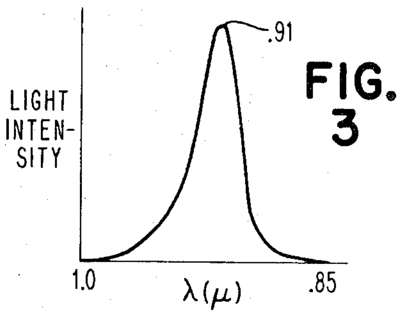
FIG. 3 is a light intensity vs. wavelength curve at room temperature for an exemplary diode of this invention characteristic of the radiation at either of the stable operating points of the current-voltage curve of FIG. 2.

The spectral distribution of the radiation from diode 10, which is from the entire P° region 17 and a small part of the P region 16 is shown in FIG. 3. Nearly the same light wavelengths are obtained at both operating points "*l*" and "c." However, the quantum efficiency of the radiation from operating point "c" is at last an order of magnitude greater than that from operating point "l."

Figure 4:
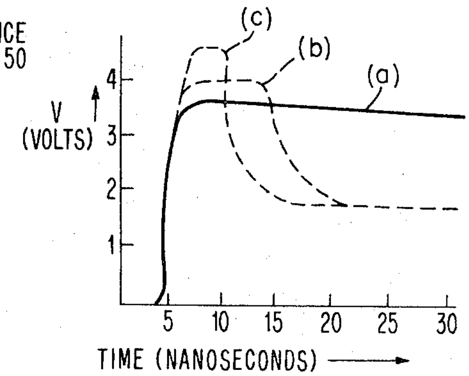
FIG. 4 is a set of voltage vs. time curves illustrating that faster switching between the low current and high-current stable states of a diode of this invention is obtained with increased voltage.

From observation of the voltage vs. time curves of FIG. 4, it will be understood that the higher the applied voltage 34 (FIG. 1), the more rapid is the switching of the stable state "l" of FIG. 2 to the stable state "c." Illustratively, it is observed that, for an applied voltage of approximately 3.5 volts, the switching time is effectively infinite; but, for a voltage of approximately 4 volts, the switching time is approximately 10 nanoseconds; and, for a voltage of 4.5 volts, the switching time is approximately 5 nanoseconds.

Figure 5:
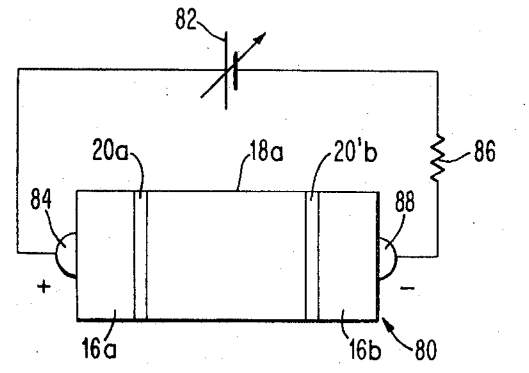
FIG. 5 is a schematic diagram of a semiconductor structure useful for determining the nature of the narrow high-resistivity zone in a diode of this invention.
Figure 6:
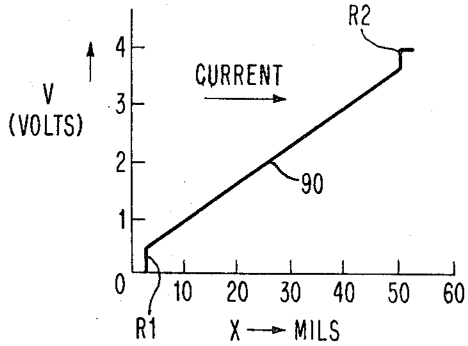
FIG. 6 is a voltage vs. distance curve for the semiconductor structure of FIG. 5, upon passage of current through it, illustrating the presence of narrow high-resistivity zones therein.

Because of the small length of diode 10 of FIG. 1, e.g., 3 mils, between surfaces 25 and 27 it is difficult to ascertain the presence of the high-resistivity zone 20 by voltage probes. Therefore, the structure of FIG. 5 is utilized to indicate unequivocally the presence of the high-resistivity zone 20. The related semiconductor structure of FIG. 5 comprises a semiconductor host 80 comparable in doping and nature to the manganese doped gallium arsenide substrate 12 of FIG. 1 except that it is considerably longer. Zinc diffused regions 16*a* and 16*b* of substantially identical length to the P region 16 of FIG. 1A are established at each end of the host semiconductor 80 bounding the high-resistivity zones 20*a* and 20*b* between which is a manganese dominant region 18 *a*. By applying current from voltage source 82 across semiconductor structure 80 via ohmic contact 84 and resistance 86 and ohmic contact 88, the voltage vs. distance along the length of semiconductor structure 80 between ohmic contacts 84 and 88 is obtained and is shown in FIG. 6 as curve 90. The sharply defined resistance changes R1 and R2 on curve 90 are indicative, respectively, of the high-resistivity zones 20*a* and 20*b* of FIG. 5. Since zones 20*a* and 20*b* of FIG. 5 are substantially identical in nature with zone 20 of FIG. 1, the high resistivity of the latter is unequivocally determined.

It has been further determined that the zones 20*a* and 20*b* of FIG. 5 are dominated by manganese. Therefore the zone 20 is properly included in the $P^o$ region 17 which is defined as a region dominated by manganese.

FABRICATION TECHNIQUES

In manufacturing an electroluminescent diode of the nature of electroluminescent diode 10 of FIG. 1, an N-type gallium arsenide region 22 is epitaxially grown on substrate 12 at interface 24 either from solution or from the vapor phase by conventional techniques. Thereafter, the substrate 12 and N-type region 22 are placed in an ampule together with zinc arsenide. The ampule is evacuated, sealed off, and placed in a furnace. Diffusion of Zn is allowed to proceed for about 3 hours at 850° C. The P-type layer is then removed from the N region 22 and the edges of the wafer as by grinding. Ohmic contacts 26 and 28 are then established on P region 16 and N region 22, respectively. Illustratively, a plurality of layers of gold, tin and indium are deposited on the surfaces of regions 16 and 22 and alloyed thereto to obtain the ohmic contacts 26 and 28. Other conventional techniques for making ohmic contacts, e.g., plating, may be employed. Typical doping levels for an electroluminescent diode of this invention are: average concentration of approximately $10^{20}$ atoms of Zn/cm.$^3$ and approximately $5\times10^{17}$ atoms of Mn/cm.$^3$ in the host GaAs; and $10^{18}$ donor atoms per cm.$^3$ in region 22.

An electroluminescent diode having negative resistance characteristics at room temperature and fast switching may be made according to the teaching of the present invention by using impurity concentrations within the general areas set forth above.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method for fabricating an electroluminescent diode with negative resistance characteristics including a semiconductor body comprising the steps of:
   establishing a gallium arsenide substrate dominantly doped with manganese;
   epitaxially growing an N-type first region in said semiconductor body of relatively low resistivity on a first surface of said substrate;
   forming three layers in said substrate by diffusion of zinc into a second surface of said substrate
   to produce a second region in said semiconductor body dominantly doped with zinc,
   said second region and said first region demarcating a third region in said semiconductor body dominantly doped with manganese,
   to discriminate said third region as a first zone and a second zone, said first zone being contiguous to said second region, and
   to produce said first zone of relatively higher resistivity than said resistivities of said second region and said second zone; and
   forming a first ohmic contact and a second ohmic contact on said first region and said second region, respectively.

2. A method as set forth in claim 1 wherein said gallium arsenide substrate is uniformly doped with said manganese.

3. A method for forming a high resistivity zone in a semiconductor body comprising the steps of:
   establishing a substrate of gallium arsenide dominantly doped with manganese; and
   forming three layers in said substrate by diffusion of zinc into a surface of said substrate
   to produce a first region and a second region in said substrate,
   said first region being dominantly doped with said manganese and being of relatively high resistivity,
   said second region being dominantly doped with said zinc and being of relatively low resistivity,
   to discriminate said first region as a first zone and a second zone, said first zone being contiguous to said second region, and
   to produce said first zone of relatively higher resistivity than said resistivities of said second region and said second zone.

4. A method as set forth in claim 3 wherein said substrate is uniformly doped with said manganese.

5. A method for fabricating an electroluminescent diode with negative resistance characteristics including a semiconductor body comprising the steps of:
   establishing a semiconductor substrate comprising gallium arsenide dominantly doped with manganese;
   epitaxially growing an N-type first region in said semiconductor body of relatively low resistivity on a first surface of said substrate;
   forming three layers in said substrate by diffusion of zinc into a second surface of said substrate
   to produce a second region in said semiconductor body dominantly doped with zinc,
   said second region and said first region demarcating a third region in said semiconductor body dominantly doped with manganese,
   to discriminate said third region as a first zone and a second zone, said first zone being contiguous to said second region, and
   to produce said first zone of relatively higher resistivity than said resistivities of said second region and said second zone; and
   forming a first ohmic contact and a second ohmic contact on said first region and said second region, respectively.

6. A method as set forth in claim 5 wherein said substrate is uniformly doped with said manganese.

7. A method for forming a high-resistivity zone in a semiconductor body comprising the steps of:
   establishing a semiconductor substrate comprising gallium arsenide dominantly doped with manganese; and forming three layers in said substrate by diffusion of zinc into a surface of said substrate to produce a first region and a second region in said substrate, said first region being dominantly doped with said manganese and being of relatively high resistivity, said second region being dominantly doped with said zinc and being of relatively low resistivity, to discriminate said first region as a first zone and a second zone, said first zone being contiguous to said second region, and to produce said first zone of relatively higher resistivity than said resistivities of said second region and said second zone.

8. A method as set forth in claim 7 wherein said substrate is uniformly doped with said manganese.

* * * * *